(12) United States Patent
Groiss

(10) Patent No.: US 7,375,576 B2
(45) Date of Patent: May 20, 2008

(54) LOG CIRCUIT AND HIGHLY LINEAR DIFFERENTIAL-AMPLIFIER CIRCUIT

(75) Inventor: Stefan Groiss, Villach-Landskron (AT)

(73) Assignee: Infineon Technologies AG, Munich (DE)

( * ) Notice: Subject to any disclaimer, the term of this patent is extended or adjusted under 35 U.S.C. 154(b) by 28 days.

(21) Appl. No.: 11/231,518

(22) Filed: Sep. 21, 2005

(65) Prior Publication Data

US 2006/0066383 A1  Mar. 30, 2006

(30) Foreign Application Priority Data

Sep. 24, 2004  (DE) ...................... 10 2004 046 349

(51) Int. Cl.
*G06G 7/24* (2006.01)
(52) U.S. Cl. ...................... 327/350; 327/513
(58) Field of Classification Search ........ 327/350–352, 327/512–513
See application file for complete search history.

(56) References Cited

U.S. PATENT DOCUMENTS

| | | | | |
|---|---|---|---|---|
| 5,883,539 | A | 3/1999 | Kimura | 327/359 |
| 6,104,243 | A * | 8/2000 | Viebach | 330/256 |
| 6,166,592 | A * | 12/2000 | Walden | 327/562 |
| 6,215,292 | B1 * | 4/2001 | Maggi et al. | 323/315 |
| 6,313,689 | B1 * | 11/2001 | Horchler | 327/379 |
| 6,603,110 | B2 | 8/2003 | Hayami et al. | 250/214 R |
| 6,636,099 | B2 * | 10/2003 | Shkap | 327/350 |
| 7,092,304 | B2 * | 8/2006 | Ogiwara et al. | 365/212 |
| 7,180,359 | B2 * | 2/2007 | DiTommaso | 327/350 |

FOREIGN PATENT DOCUMENTS

JP         2001068943 A         3/2001

OTHER PUBLICATIONS

"Halbleiter-Schaltungstechnik" von U. Tietz, Ch. Schenk, Halbleiter-Schaltungstechnik, 9. Auflage, Berlin, Springer-Verlag, pp. 334-336.

* cited by examiner

*Primary Examiner*—Dinh T. Le
(74) *Attorney, Agent, or Firm*—Dicke, Billig & Czaja, PLLC

(57) ABSTRACT

A log circuit receives an operated current signal and a reference current signal at respective inputs and comprises an operand log circuit including a first bipolar semiconductor device and being configured to generate a first logarithmized signal on the basis of the operand current signal, a reference log circuit including a second bipolar semiconductor device and being configured to generate a second logarithmized signal on the basis of the reference current signal, and a differential-amplifier circuit receiving the first logarithmized signal and the second logarithmized signal, and outputting a differential-amplifier output signal in dependency on the first logarithmized signal and the second logarithmized signal. The differential amplifier is configured such that its amplification depends on a thermal voltage of a bipolar semiconductor device, so that at the output signal of the differential amplifier, the temperature dependency of the difference between the first logarithmized signal and the second logarithmized signal is counteracted.

15 Claims, 6 Drawing Sheets

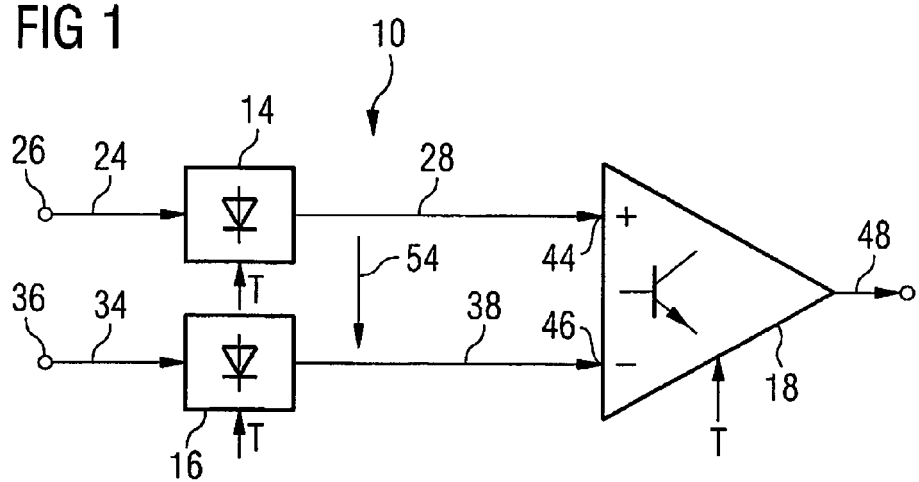
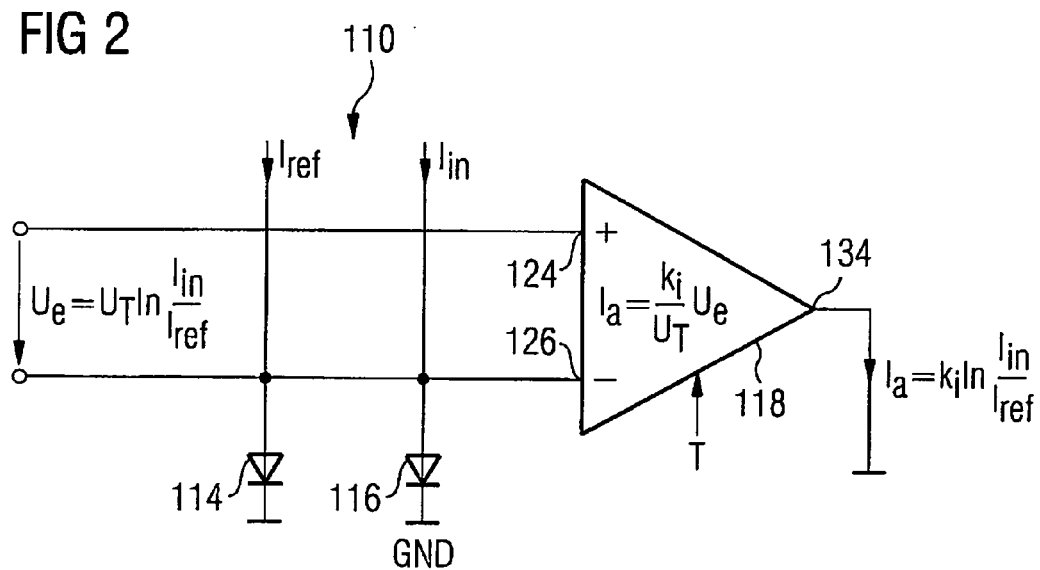

LOG CIRCUIT AND HIGHLY LINEAR DIFFERENTIAL-AMPLIFIER CIRCUIT

CROSS-REFERENCE TO RELATED APPLICATION

This application claims priority from German Patent Application No. 102004046349.2, which was filed on Sep. 24, 2004, and is incorporated herein by reference in its entirety.

Technical Field

The present invention generally relates to a log circuit configured to logarithmically map an input signal to an output signal, and specifically relates to a highly precise log circuit, the temperature dependency and linearity of which is improved by using a highly linear temperature-compensated differential amplifier.

Background

There is a general requirement placed upon log circuits to logarithmically map an input signal having a very small error and very low temperature dependency to an output signal. Typically, an input signal range of several decades having a very small relative error (smaller than 0.001 and even smaller) is to be mapped to an output. Log circuits have a wide field of application and may be employed particularly advantageously wherever signal variables, or measured variables, may vary across several orders of magnitude. In this case, further processing of a logarithmized signal is substantially more advantageous than directly processing the original signal, and places fewer requirements upon the linearity and the resolution capability of the downstream circuit parts.

Conventionally, logarithmization is preferably effected by bipolar diodes. However, the thermal voltage UT=kT/q (k: Boltzmann constant; T: absolute temperature; q: elementary charge) causes undesired temperature dependency which needs to be eliminated in order to obtain a temperature-stable output signal. The standard textbook "Halbleiter-Schaltungstechnik" (semiconductor circuit technology) by U. Tietze and Ch. Schenk (U. Tietze, Ch. Schenk, Halbleiter-Schaltungstechnik, 9$^{th}$ edition, Berlin, Springer-Verlag, 1990) shows, in its 9$^{th}$ edition on pages 334-336, a log circuit wherein a temperature dependency caused by thermal voltage UT (temperature coefficient) is compensated for by temperature-dependent resistive-divider networks. However, this has the disadvantage that two different physical effects, i.e. the thermal voltage in semiconductor devices, and the temperature dependency of resistors due to the temperature coefficient, are used for temperature compensation. The use of two different physical effects may cause large errors in combination with inevitable process tolerances.

The publications U.S. Pat. No. 6,603,110 B2 and JP 2001068943-A depict an amplifier circuit, the amplification of which is essentially inversely proportional to the absolute temperature. Here, temperature compensation is effected by a plurality of resistor/thermistor pairs connected in series. The circuits depicted in said publications are also suited to achieve a temperature compensation of optical receivers, in turn, by means of temperature-dependent resistors.

Conventional circuits for temperature compensation of logarithmizers exhibit considerable drawbacks. For example, it is often not possible at low cost to employ the temperature-dependent resistors required. In particular, the use of temperature-dependent resistors with monolithic integration is problematic, since the materials used are not always compatible with the semiconductor processes employed. In addition, two physical effects, i.e. the thermal voltage and the temperature coefficient of resistors, are employed, the temperature responses of which do not accurately match. Thus, precise compensation for temperature dependency is not possible.

SUMMARY

It is the object of the present invention to provide a log circuit with improved temperature compensation as well as a differential-amplifier circuit which may be employed advantageously for this purpose.

In accordance with a first aspect, the invention a log circuit having:

an operand signal input for receiving an operand current signal;

a reference signal input for receiving a reference current signal;

an operand log circuit including a first semiconductor device and being configured to generate, on account of the operand current signal, a first logarithmized signal dependent, due to a preset physical effect, on a non-linear characteristic of the first semiconductor device, the first logarithmized signal being dependent on a temperature exhibited by the log circuit;

a reference log circuit including a second semiconductor device and being configured to generate, on account of the reference current signal, a second logarithmized signal depending on a non-linear characteristic of the second semiconductor device, the second logarithmized signal being dependent, due to the preset physical effect, on the temperature exhibited by the log circuit; and a differential-amplifier circuit including a first differential-amplifier input for receiving the first logarithmized signal, and a second differential-amplifier input for receiving the second logarithmized signal, as well as a differential-amplifier output for outputting a differential-amplifier output signal as a function of the first logarithmized signal and the second logarithmized signal, the differential-amplifier circuit being configured such that its amplification is dependent, due to the preset physical effect, on the temperature exhibited by the log circuit, so that in the output signal of the differential amplifier, the temperature dependency of the difference between the first logarithmized signal and the second logarithmized signal is counteracted.

In accordance with a second aspect, the invention provides a differential-amplifier circuit having:

a first signal input and a second signal input;

a first signal output and a second signal output;

first, second, third and fourth transistors comprising respective source terminals, collective controls and control terminals;

a current source circuit;

the source terminals of the first, second, third and fourth transistors being connected to the current source circuit;

the collective terminals of the first and third transistors being coupled to the first signal output;

the collective terminals of the second and fourth transistors being coupled to the second signal output; and the control terminal of the first transistor being coupled to the first signal input, and the control terminal of the second transistor being coupled to the second signal input; and a control voltage circuit for providing control voltages at the control terminals of the third and fourth transistors on the basis of a combination of input voltages applied to the first and second signal inputs.

The core idea of the present invention is that temperature compensation of a log circuit having two log elements may be effected in the best possible way if the log element has connected a differential amplifier downstream therefrom, the amplification of which with regard to the temperature response is influenced by the same physical effect that is responsible for the temperature dependency of the log elements, the temperature dependency just counteracting the amplification of the temperature dependency of the log elements. It has also been found that a differential amplifier being particularly suited for use in said log circuit is one that comprises four transistors, the base voltages of which are generated on account of a combination of the logarithmized signals.

Thus, the present invention provides the benefit that both the temperature dependency of the log elements and the temperature dependency of the subsequent differential amplifier are influenced by the same physical effect. If the differential amplifier is configured such that its temperature dependency just counteracts the temperature dependency of the log elements, almost ideal compensation for the temperature response of the log elements is possible. To be precise, it is to be expected that the temperatures of the log elements and of the circuit elements in the differential amplifier will change in the same manner. This is particularly true if the log elements and the subsequent differential amplifier for temperature compensation are monolithically integrated. Of course, a precondition is that there is a thermal coupling between the log elements and the differential amplifier. In addition, it is advantageous for an inventive log circuit to use only semiconductor devices and fixed resistors, but no temperature-dependent resistors for determining the circuit properties. In particular, this enables monolithic integration of the log circuit, which is typically rendered complicated by the use of temperature-dependent resistors. In addition, manufacturing cost may be clearly reduced by dispensing with temperature-dependent resistors. Moreover, the inventive log circuit is less sensitive to process variations, since at least with monolithic integration of the log elements and the differential amplifier, the temperature dependencies of the two components are determined by the same process steps. If the process varies, the temperature dependencies both of the log elements and of the differential amplifier change in the same manner. This sets an inventive log circuit apart from conventional circuitries, wherein various physical effects and, thus, also various process steps influence the process dependencies of the log elements and of the differential amplifier.

In addition, the circuit expenditure and the circuit complexity of an inventive log circuit are small as compared with conventional circuits, wherein operational amplifiers are typically used. However, an operational amplifier includes a multiplicity of individual transistors. This increases both design complexity and current consumption. An inventive circuit, on the other hand, comprises a clearly smaller number of transistors and passive devices.

Finally, an inventive differential-amplifier circuit contributes to improving the linearity, and, thus, the accuracy of a log circuit. Thus, the inventive differential-amplifier circuit meets the requirements placed upon a temperature-compensating differential-amplifier circuit in an ideal manner. The high level of linearity of the inventive differential-amplifier circuit enables, when using an inventive log circuit, to logarithmize an input signal which varies across several orders of magnitude, with a relatively small error. Thus, highly precise logarithmization is possible.

In a preferred embodiment of the present invention, the preset physical effect is a dependency of a charge-carrier distribution, which describes energy distribution of movable charge carriers in a semiconductor material, on the temperature. Typically, said energy distribution is a Boltzmann type of distribution or a Fermi-Dirac type of distribution. Such a distribution is preset by basic laws of statistical mechanics and of thermodynamics and is therefore reliably reproducible.

In a further preferred embodiment, the first and second semiconductor devices, which serve as log elements, are bipolar semiconductor devices. In addition, in this case, the differential amplifier is configured such that its amplification depends on the thermal voltage of a bipolar semiconductor device. Such a configuration has the advantage that both the temperature dependency of the bipolar log elements and the temperature dependency of the amplification depend on the thermal voltage. Thus, it is possible to achieve almost ideal compensation for the temperature dependencies. Manufacturing-induced tolerances have the same effect on the log means and the differential amplifier.

In a further embodiment, the first and second semiconductor devices are field-effect devices. Here, amplification of the differential-amplifier circuit is preferably equally determined by a field-effect device. Again, this has the advantage that the temperature dependencies of the log circuits and of the differential amplifier depend on the same effect and may be configured to counteract each other.

In a preferred embodiment of an inventive log circuit, the first logarithmized signal generated by the operand log circuit is proportional, with a fixed operand current signal, to an absolute temperature exhibited by the operand log circuit. Similarly, the second logarithmized signal generated by the reference log circuit is proportional, with a fixed reference current signal, to the absolute temperature. However, the amplification of the differential amplifier is preferably inversely proportional to the absolute temperature. Laying out a log circuit in such a manner provides the benefit that the temperature dependencies of the bipolar log elements may be balanced out in an almost ideal manner by the differential amplifier. Furthermore, it is to be noted that a previously described temperature dependency is achievable at low technical expenditure. Specifically, with logarithmization it is convenient to consider the current flowing through a bipolar log element as an input variable to tap off the voltage as a logarithmized quantity. The exponential characteristic curve of a bipolar log element here provides for the logarithmization. What is characteristic of a semiconductor device is typically a connection between the current and the ratio of the voltage applied and the thermal voltage. What results therefrom is that with a preset current, a voltage is proportional to the thermal voltage, which, in turn, is proportional to the absolute temperature. Thus, the above-described association of the temperature dependencies with a log element and a differential amplifier corresponds to a naturally given dependency, so that the circuit may readily be realized in a direct manner.

In a further preferred embodiment, the differential amplifier exhibits a highly linear transfer characteristic characterized in that a relative error of the differential-amplifier output signal is smaller than 1% in relation to a target value if the amount of a voltage difference between the first and second logarithmized signals applied to the inputs of the differential amplifier equals that of the thermal voltage. Such a highly linear configuration of the differential amplifier is advantageous since as a result, the differential amplifier does not introduce any major distortion of the transfer characteristic curve of the logarithmizer. However, a distortion especially of the logarithmized signal is highly inconvenient, since a small change in the logarithmized signal indicates a large relative change in the original signal. Accordingly, the precision of inventive log circuits is substantially improved by employing a highly linear differential amplifier. Thus, it is possible to operate an inventive logarithmizer with a high precision in combination with input signals which vary across several decades.

In an embodiment of the present invention, the first and second bipolar semiconductor devices are diodes. Diodes exhibit exponential dependency of the current on the voltage. If a fixed current is impressed, the voltage across the diode is dependent on the current in a logarithmic manner. Thus, a bipolar diode exhibits precisely the property of a log element. Thus, a logarithmization may be achieved by means of a single semiconductor device. The use of two diodes provides the benefit that the dependency of the logarithmization result on the reverse saturation current $I_S$ is eliminated. In a differential evaluation, it is rather only the quantity of a reference current, the measurement current and the value of the thermal voltage that are accounted for in the result.

In a preferred embodiment, the first and second bipolar semiconductor devices are bipolar transistors. Said bipolar transistors exhibit similar properties to those of the bipolar diodes discussed above, however, unlike the bipolar diodes, with the bipolar transistors, it is not necessary to include a correction factor, which, with diodes, effects a scaling of the thermal voltage. Thus, with bipolar transistors, the connection between current and voltage is predetermined at a higher level of accuracy than is the case when using bipolar diodes.

In accordance with the above illustrations, it is advantageous for the non-linear characteristic used in the logarithmization to be a transfer characteristic curve of a bipolar diode. What is considered a bipolar diode here is both a single bipolar diode and a bipolar diode which is part of a transistor structure.

In a preferred embodiment, the logarithmized signals are specified by a voltage drop across a bipolar diode which is part of a bipolar semiconductor device, a current proportional to the signal to be logarithmized flowing through the bipolar diode in each case. Here, the characteristic curve of the bipolar diode is exploited, the bipolar diode exhibiting a logarithmic characteristic curve with regard to its current-to-voltage transfer behavior.

Preferably, two diodes and/or diode regions of bipolar transistors are used for logarithmization, wherein either the anodes or the cathodes exhibit a same potential. Such an arrangement provides the advantage that the voltage difference between the open terminals not connected to the same potential is a measure of the logarithmic ratio of the two currents flowing through the diodes and/or diode regions. With such an arrangement, the influence of the reverse saturation current $I_S$ is fully eliminated. In addition, in the difference voltage, there will be no more linear proportion that may lead to a corruption of the result. In particular, the difference voltage equals 0 if the same current flows through both diodes and/or diode regions. This corresponds to the logarithm of 1, which, as is known, is 0.

What is preferred, coincidentally, with an inventive log circuit is a differential amplifier comprising four transistors, two of which are connected in parallel, respectively, with regard to their source terminals and their collective terminals. One transistor, in each case, of a parallel connection is directly driven by an input voltage of the differential amplifier, the other transistor obtains, at its control input, a signal formed from a combination of the two input signals of the differential amplifier. Such an implementation of a differential amplifier is advantageous in achieving a high level of linearity without using a feedback network and without the amplifier's temperature-compensating property being lost. Thus, the use of an inventive differential amplifier enables the achievement a log circuit exhibiting a high level of linearity without having to dispense with temperature compensation. This principle is contrary to conventional differential amplifiers which employ operational amplifiers. The linearity of such conventional circuits results from a passive feedback network, while the transfer characteristic curve of the amplifier element is not accounted for, or is accounted for only to a very low extent, in the overall transfer characteristic, as long as it is ensured that the amplification of the differential amplifier is high enough. However, in the inventive concept, the differential amplifier is linearized in the forward path of the amplifier without using global external feedback. Thus, the transfer characteristic of the amplifier, in particular also the temperature dependency of the amplification, continues to be accounted for in the transfer characteristic of the entire differential-amplifier circuit. This enables the temperature response of a bipolar log element to be compensated for while at the same time ensuring a sufficient level of linearity.

In a preferred embodiment, bipolar transistors are used as transistors in an inventive differential amplifier. This provides the benefit that the thermal voltage $U_T$ is accounted for in the transfer characteristic of the bipolar transistors. Thus, the amplification of the differential amplifier is inversely proportional to the thermal voltage. Accordingly, the amplifier circuit fulfills the task of achieving temperature compensation for the log elements.

In a further preferred embodiment, the emitter area of the first bipolar transistor equals the emitter area of the second bipolar transistor, and the emitter area of the third bipolar transistor equals the emitter area of the fourth bipolar transistor. Such an implementation provides the advantage that due to the symmetrical transistor geometry, the transfer characteristic of the circuit with regard to input voltages U1 and U2 is also symmetrical. This is favorable in that the circuit then may be operated about an operating point in both directions in the same way. Preferably, the emitter areas of the third and fourth transistors equal n times the emitter areas of the first and second bipolar transistors, n being a real value between 0.5 and 20. A change in the emitter area enables an adjustment of the transfer characteristic to the respective requirements made. The variation in the emitter areas enables, in particular, to set an optimum compromise between amplification and linearity. Thus, it is possible to adjust the differential-amplifier circuit to the dynamic range of the log circuit.

Preferably, the control voltage circuit generating control voltages for the transistors is configured such that the control voltages applied to the control terminals of the third and fourth transistors are linear combinations of the input voltages applied to the first and second signal inputs, except for deviations due to loads caused by currents flowing through the control terminals of the transistors. This provides the benefit that the control voltage circuit may be structured in a purely linear manner. In particular, it is not mandatory to use active devices in the control voltage circuit.

In addition, it is preferred to design the control voltage circuit such that the control voltages applied to the control terminals of the third and fourth transistors are identical. This entails further symmetrization of the circuitry. In addition, it is advantageous for the control voltage applied to the control terminals of the third and fourth transistors to be the same as the average of the control voltages applied to the control terminals of the first and second transistors, apart from disruptive influences by a load on the control voltage circuit. One has been able to show that in this case, common-mode gain is suppressed in an optimum manner if it is assumed that the current source connected to the source terminals of the transistors has an infinite internal resistance.

Preferably, the control voltage circuit includes a voltage-divider network connected between the first and second signal inputs of the differential amplifier, the control terminals of the transistors being coupled to nodes of the voltage-divider network. Thus, various voltages at the control terminals of the transistors may be generated by a simple resistive voltage-divider network. The circuitry expenditure is low, and the linearity of a resistive network is very good.

In addition, it is preferred, however, for the control voltage circuit to further comprise buffer means connected between the nodes of the voltage-divider network and the control inputs of the transistors. The buffer means decouple the control terminals of the transistors from the voltage-divider network. Thus, the voltage-divider network is not loaded, and a voltage which equals the no-load voltage of the non-loaded voltage-divider system is available at the control terminals of the transistors. Thus, the level of linearity is increased. The influence of the transistor control current on the voltage-divider network is minimized. What is achieved, thus, is that the linearization of the differential amplifier is independent of the properties of the transistors. In particular, a current amplification of bipolar transistors has no influence on the linearity of the differential amplifier. Preferably, the buffer means comprise a current feedback configured such that the voltages applied to the control terminals of the transistors are dependent only on the input voltages of the buffer means and are independent of the currents flowing through the control terminals of the transistors. By installing a current feedback into the buffer means, the load dependency of the buffer means is again reduced. Therefore, a control loop exists in the buffer means which improves the linearity of the entire differential amplifier.

In a further embodiment of the present invention, the control voltage circuit is configured such that the voltage difference between two control terminals of any two transistors is smaller, in amount, than the voltage difference between the first and second signal inputs. Such a configuration means that the differential signal applied to the first and second signal inputs is attenuated before it is fed to the transistors, which form the actual differential-amplifier core. Such an attenuation extends the linearity range of the differential amplifier. Due to the attenuation of the differential input signal, the differential amplifier is in a linear operating state even for larger input signals. Thus, non-linear distortions are reduced.

In a further preferred embodiment, the differential amplifier includes a current subtraction circuit configured to generate, from the first current output signal applied to the first signal output, and from a second current output signal applied to the second signal output, an overall output signal by forming the difference between the currents of the first and second current output signals. The actual linearized output signal of the differential amplifier is the difference of the currents of the first and second current output signals. It is therefore advantageous to provide a means which forms a difference between the two current signals. Once the difference has been formed, there will be an overall output signal which is now characterized only by a current. Thus, transmission of the signal is possible by means of only one line (in connection with a return line). Thus, it is now no longer required to have two lines (plus return line). In an advantageous embodiment, the current subtraction circuit includes a current mirror circuit. Such a current mirror circuit allows subtraction of two currents, since a current with an opposite sign and/or an opposite current direction is made available.

BRIEF DESCRIPTION OF THE DRAWINGS

Preferred embodiments of the present invention will be explained below in more detail with reference to the accompanying figures, wherein:

FIG. 1 shows a block diagram of a temperature-compensated log circuit in accordance with a first embodiment of the present invention;

FIG. 2 shows a block diagram of a temperature-compensated log circuit in accordance with a second embodiment of the present invention;

DETAILED DESCRIPTION

Figure 3:
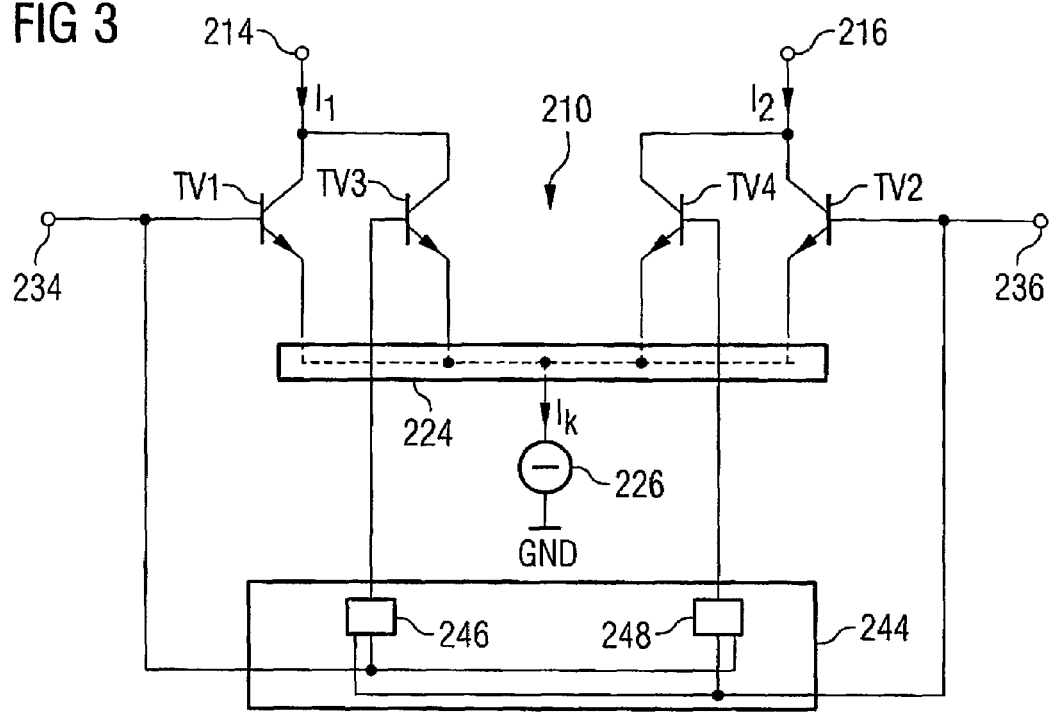
FIG. 3 shows a schematic circuit diagram of an inventive differential amplifier in accordance with a third embodiment of the present invention.

FIG. 1 depicts a block diagram of a temperature-compensated log circuit in accordance with a first embodiment of the present invention. The log circuit is designated by 10 in its entirety. The log circuit includes an operand log circuit 14, a reference log circuit 16 as well as a differential-amplifier circuit 18. The operand log circuit 14 receives an operand current signal 24 from an operand signal input 26, and generates a first logarithmized signal 28. Similarly, reference log circuit 16 receives a reference current signal 34 from a reference signal input 36, and on the basis thereon generates a second logarithmized signal 38. Differential-amplifier circuit 18 receives the first logarithmized signal 28 at the first differential-amplifier input 44, and receives the second logarithmized signal 38 at the second differential-amplifier input 46. Eventually, differential-amplifier circuit 18 generates a differential-amplifier output signal 48 in dependency on the first logarithmized signal 28 and the second logarithmized signal 38. In addition, it is to be noted that operand log circuit 14, reference log circuit 16 and differential-amplifier circuit 18 essentially have the same absolute temperature T. This is achieved by good thermal coupling as is given, for example, with monolithic integration. However, it is also to be noted that any local warming should not be too intense, since in that case, the above condition is no longer met.

On the basis of the structural description of the present temperature-compensated log circuit the circuit's mode of operation will be described below. Operand log circuit 14 receives an operand current signal 24 and generates, based thereon, a first logarithmized signal 28. For this purpose, a non-linear (exponential) characteristic of a bipolar semiconductor device is exploited. The semiconductor device may be, for example, a bipolar semiconductor diode or a diode region which is part of a bipolar transistor. Preferably, the input signal used is a current signal (operand current signal 24), whereas the output variable used is a voltage signal (first logarithmized signal 28). Such an arrangement offers the advantage that the non-linear (exponential) characteristic curve of the bipolar semiconductor diode may be exploited directly. However, there is a possibility of introducing a current-to-voltage conversion and/or a voltage-to-current conversion, so that, in principle, any signal type may be used. In addition, it is to be stated that the characteristic curve of the bipolar semiconductor device is dependent on a thermal voltage $U_T$ due to the properties of the bipolar element. In a typical embodiment, the output signal of operand log circuit 14 is proportional to thermal voltage $U_T$ and, thus, to the absolute temperature T. The same applies to reference log circuit 16, which receives reference current signal 34 and generates the second logarithmized signal 38 on the basis thereof.

With a corresponding layout of operand log circuit 14 and reference log circuit 16, in particular with equal dimensioning using identical bipolar semiconductor devices, a difference voltage 54, which equals the difference of the voltages of the first and second logarithmized signals, is ideally dependent only on operand current signal 24, reference current signal 34, the absolute temperature and further natural constants. What is dispensed with, in particular, is a dependency on the reverse saturation current $I_S$ of the bipolar semiconductor devices which serve to form the logarithm. In addition, proportionality constants may naturally be accounted for, which, however, are constant in the event of an appropriate circuit layout. In a preferred layout, the difference voltage 54 is proportional to the logarithm of the ratio of operand current signal 24 and reference current signal 34. In addition, the difference voltage 54 is commonly directly proportional to the absolute temperature T. It is the object of the differential amplifier 18 to balance off the temperature dependency of difference voltage 54. This is achieved in that the amplification of the differential-amplifier circuit 18 is inversely proportional to the absolute temperature T. In accordance with the present invention, the differential amplifier is configured such that its amplification, i.e. the ratio between difference voltage 54 and differential-amplifier output signal 48, is inversely proportional to the absolute temperature T. An ideal temperature compensation results when the amplification of the differential amplifier is dependent on the thermal voltage of a bipolar semiconductor device. In this case, the temperature dependency of difference voltage 54, and the temperature dependency of the amplification of the differential-amplifier circuit 18 are based on the same physical effect, i.e. on the widening of the Fermi distribution of the charge carriers as the temperature increases. In this case, it must be ensured, by appropriate circuit layout, that the amplification of the differential-amplifier circuit 18 decreases if the difference voltage 54 increases due to a change in temperature. Such a behavior, however, may be achieved without any major technical expenditure.

In the embodiment described, it is assumed that due to the characteristic of operand log circuit 14 and/or reference log circuit 16, difference voltage 54 increases as the absolute temperature T increases. Thus, it is necessary for the amplification of differential-amplifier circuit 18 to decrease as the absolute temperature increases, i.e. is inversely proportional to the absolute temperature T. On the other hand, however, it is also possible for operand log circuit 14 as well as reference log circuit 16 to be configured such that difference voltage 54 decreases as the temperature increases. In this case, differential-amplifier circuit 18 must be configured such that the amplification increases as the temperature increases. What is decisive for the present invention is only that these mutually inverse temperature dependencies of log circuits 14, 16 and of differential-amplifier circuit 18 are based on a change in the thermal voltage in a bipolar semiconductor device.

The circuitry described may be modified within a wide range. In particular, it is possible to use a multiplicity of different log circuits, as long as it is ensured that their temperature dependencies are based on a change in the thermal voltage along with the temperature. In particular, both bipolar diodes and bipolar transistors may be employed. The use of diode devices exploiting the field effect is also possible. For example, MOSFET diodes operated in a weak inversion exhibit an exponential characteristic curve. They are therefore suitable as log elements. The implementation of differential-amplifier circuit 18 may also be selected as desired as long as it is ensured that the amplification of differential-amplifier circuit 18 is substantially determined by a thermal voltage. Both bipolar differential amplifiers and differential-amplifier circuits with field-effect transistors are possible here, differential-amplifier circuits with bipolar transistors inherently exhibiting suitable temperature dependency of the amplification on the thermal voltage, whereas with differential amplifiers having field-effect transistors, an additional circuit may have to be provided, as the case may be, for controlling the amplification in dependency on the thermal voltage, depending on the operating point at which the field-effect transistors are operated. Such a circuit may suitably influence, for example, current sources of a differential amplifier having field-effect amplifier transistors, so that the amplification is adjusted depending on the thermal voltage of a bipolar semiconductor device as a result. However, compensation for temperature dependency is also possible with field-effect transistors alone. The latter is preferred when MOSFET diodes or other field-effect devices are used as log elements.

FIG. 2 depicts a block diagram of a temperature-compensated log circuit in accordance with a second embodiment of the present invention. The log circuit is designated by 110 in its entirety. The circuitry comprises a first diode 114 as well as a second diode 116. In addition, log circuit 110 includes a differential-amplifier circuit 118. The anode of second diode 116 is connected to the positive differential-amplifier input 124. In addition, a current $I_{in}$ is impressed at this node. The anode of the first diode 114 is connected to the negative differential-amplifier input 126 of differential-amplifier circuit 118. A reference current $I_{ref}$ is fed to the respective node. The cathodes of first diode 114 and second diode 116 are connected to reference potential GND. A differential-amplifier output current $I_a$ is made available at output 134 of differential-amplifier circuit 118. In addition, the voltage between the positive differential-amplifier input 124 and the negative differential-amplifier input 126 is defined as differential-amplifier input voltage $U_e$.

On the basis of the structural description of the present inventive circuitry, the circuit's mode of operation will be described below. For logarithmic mapping of an input current $I_{in}$ onto an output signal, the transfer characteristic curve of a bipolar diode is used. This characteristic reads $$I_{in} = I_s \left( e^{\frac{U_D}{NU_T}} - 1 \right) \tag{1}$$

$U_D$ here refers to the voltage across the diode, $$U_T = \frac{kT}{q}$$

refers to the thermal voltage. Since with the signal variables used here, $U_D \gg U_T$, the transfer characteristic may be simplified so as to read $$I_{in} = I_s e^{\frac{U_D}{NU_T}} \tag{2}$$

If two bipolar diodes are operated in a forward direction such that their cathodes have the same potential, a potential difference $U_e$ of the anode voltages results due to the transfer characteristic in accordance with (2), as $$U_e = U_T \ln \frac{I_{in}}{I_{ref}} \tag{3}$$

Said potential difference already contains the logarithmic property, but due to the influence of the thermal voltage, the potential difference is highly temperature-dependent. This property may be compensated for by the differential-amplifier circuit 118 connected downstream from the two diodes 114, 116. To achieve compensation for the temperature coefficients of both diodes 114, 116, the differential-amplifier circuit must exhibit a transfer characteristic of the following form:

$$I_a = \frac{k_i}{U_T} U_e \tag{4}$$

$I_a$ designates the output signal of differential-amplifier circuit 118. Said output signal may either be a current or the difference between two currents (difference output current). $U_e$ is the input signal of the differential amplifier (difference input voltage). It is to be noted that instead of output current $I_a$, an output voltage which logically comes into being due to the differential-amplification voltage $U_e$ in accordance with the formula $$U_a = \frac{k_u}{U_T} U_e \tag{4a}$$

may also be used. $k_i$ and/or $k_u$ are amplifier constants having the corresponding units (ampere and/or unit-free), the constants $k_i$ and/or $k_u$ preferably comprising no further temperature dependency. Ideally, $k_i$ and/or $k_u$ are dependent on circuit parameters only and are thus invariable in the event of a change in external environmental conditions.

There are several possibilities of realizing a circuit exhibiting the transfer property in accordance with (4) and/or (4a). For example, a conventional differential-amplifier stage comprising a current source and two bipolar transistors about the zero point of input voltage $U_e$ exhibits such a property, but due to the non-linear tanh (tangens-hyperbolicus) characteristic, the exploitable input voltage range is relatively small. For example, the relative error of $I_a$ as compared with the ideal (linearized) value for $U_e = U_T$ is about 8%. An input voltage of $U_e = U_T$ is achieved when the input current $I_{in}$ is e times the reference current $I_{ref}$, e here is the Euler number, i.e. the basis of the natural logarithm. It should also be noted that with the present circuitry, the differential-amplifier input voltage $U_e$ is $2.3 \cdot U_T$ in the event that input current $I_{in} = 10 \cdot I_{ref}$. For $I_{in} = 100 \cdot I_{ref}$, $U_e = 4.6 \cdot U_T$, and for $I_{in} = 1000 \cdot I_{ref}$, $U_e = 6.9 \cdot U_T$. Thus, it shows that for a large dynamic range of input current $I_{in}$, a large linear range of the differential-amplifier circuit 118 is required. A differential-amplifier circuit exhibiting improved linearity compared with a conventional, simple differential amplifier stage, including a current source and two bipolar transistors, will be shown below.

FIG. 3 shows a schematic circuit diagram of an inventive differential amplifier stage in accordance with a third embodiment of the present invention. The differential-amplifier circuit is designated by 210 in its entirety. Four transistors TV1, TV2, TV3, TV4, which, in the present embodiment, are npn bipolar transistors, form the core of the differential-amplifier circuit 210. The collector-emitter paths of first transistor TV1 and third transistor TV3 are connected in parallel. The collector terminals of first and third transistors TV1, TV3 are coupled to a first signal output 214 and provide a first output current $I_1$. The collector-emitter paths of second transistor TV2 and fourth transistor TV4 are also connected in parallel. The collector terminals of the second and fourth transistors TV2, TV4 are connected to a second signal output 216 and provide the second output current $I_2$. The emitter terminals of all four transistors are connected via a coupling network 224 in a current source 226, which provides a base current $I_k$. In addition, a first signal input 234 is connected to the base terminal of first transistor TV1. Similarly, a second signal input 236 is connected to the base terminal of second transistor TV2. The input voltages applied to the first and second signal inputs 234, 236 are further supplied to a control voltage circuit 244. Within the latter, the input voltage from the first signal input 234 and the second signal input 236 are combined in combining networks 246, 248, the output voltages of the combining networks 246, 248 being supplied to the base terminals of third and fourth bipolar transistors TV3 and TV4.

On the basis of the structural description, the mode of operation of the present differential-amplifier circuit 210 will be described below. The differential-amplifier circuit includes two branches, each branch comprising two bipolar transistors. One of the bipolar transistors TV1, TV2 of one branch, respectively, receives its base voltage directly from a signal input 234, 236. The second bipolar transistor of a branch TV3, TV4 receives a base voltage formed by a combination of the input voltages at the first signal input 234 and the second signal input 236. Thus, unlike with a conventional differential-amplifier circuit, the strict separation of the two branches is eliminated in that the base voltage of one of the two transistors in each branch is influenced by both input voltages. The fact that the input voltages at both signal inputs 234, 236 drive the transistors of both differential-amplifier branches, respectively, has a balancing effect. In particular, the performance of the transistors in both differential-amplifier branches is prevented from becoming too non-linear. The second transistor TV3, TV4 of each branch, the base voltage of which is dependent on both input voltages, is driven to a lesser degree than the first transistor TV1, TV2 of the respective branch.

The inventive circuitry is thus capable of providing improved linearity of the transfer characteristic than has been possible with conventional differential-amplifier circuits.

Figure 4:
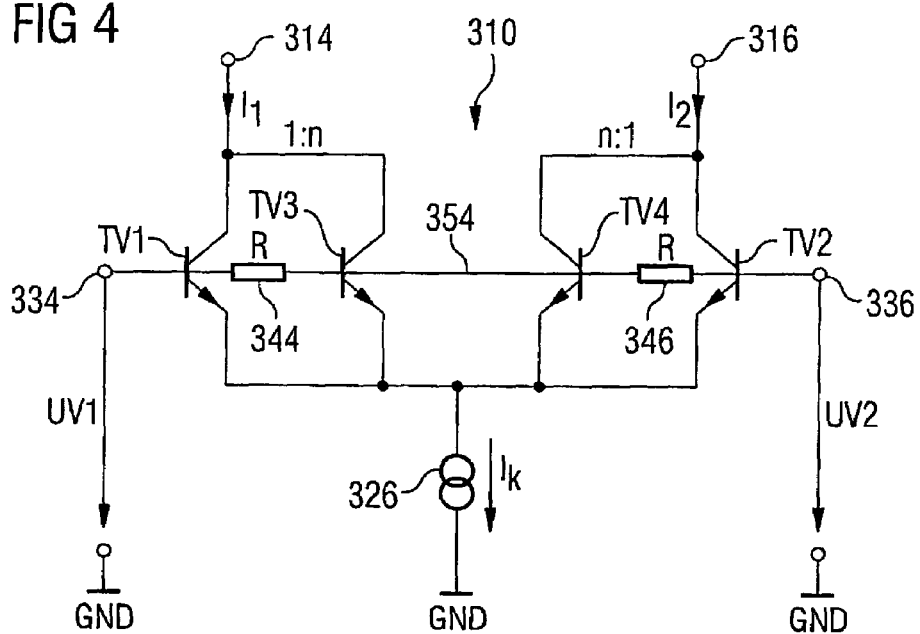
FIG. 4 shows a circuit diagram of an inventive differential amplifier in accordance with a fourth embodiment of the present invention.
Figure 5:
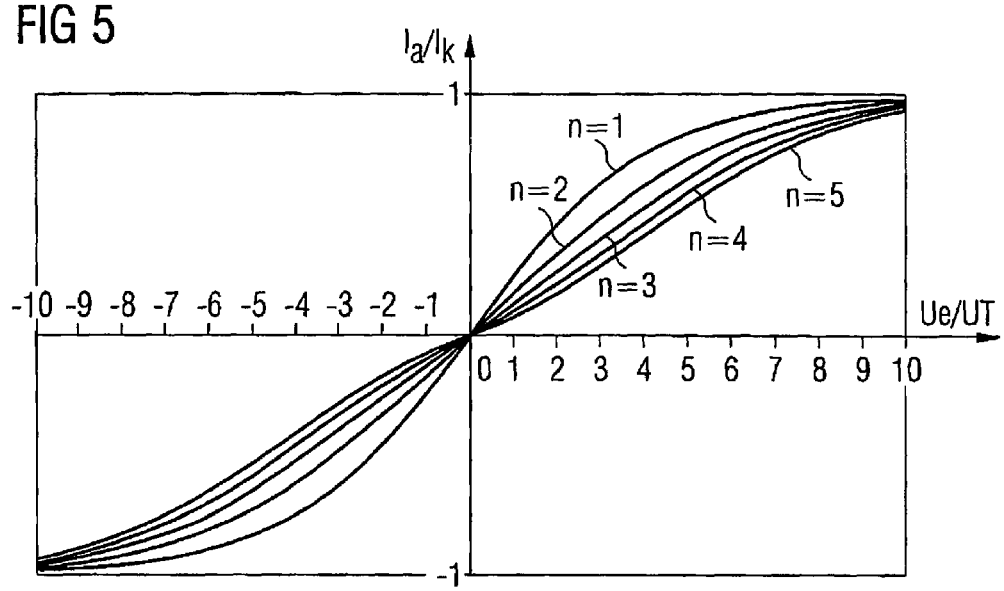
FIG. 5 shows a transfer characteristic curve of an inventive differential amplifier in accordance with a fourth embodiment of the present invention.

FIG. 4 shows a circuit diagram of an inventive differential amplifier in accordance with a fourth embodiment of the present invention. The differential-amplifier circuit is designated by 310 in its entirety. It comprises four bipolar transistors TV1, TV2, TV3 and TV4. The collector-emitter paths of the first bipolar transistor TV1 and of the third bipolar transistor TV3 here are connected in parallel, bipolar transistors TV2 and TV4. The collector terminals of first bipolar transistor TV1 and third bipolar transistor TV3 are connected to a first signal output 314 and provide a first output current $I_1$. The collector terminals of second and fourth bipolar transistors TV2, TV4 are connected to a second signal output 316 and provide a second output current $I_2$. The emitter terminals of all four transistors are connected to a current source 326, which provides a base current $I_k$ and is connected, with its second terminal, to reference potential GND. The base terminal of first bipolar transistor TV1 is connected to first signal input 334. The input voltage applied to the first signal input 334 and related to the reference potential GND is referred to as UV1. Similarly, the base terminal of second bipolar transistor TV2 is connected to the second signal input 336, and the second input voltage applied to this terminal and related to reference potential GND is designated by UV2. A resistive voltage-divider network consisting of a first resistor 344 and a second resistor 346 is connected between first signal input 334 and second signal input 336, the central node of the voltage-divider network being referred to as 354. In addition, the base terminals of the third bipolar transistor TV3 and the fourth bipolar transistor TV4 are connected to the central node 354 of the resistive voltage-divider network. Eventually it is to be stated that the emitter areas of the third bipolar transistor TV3 and of the fourth bipolar transistor TV4 are each n times as large as the emitter areas of first and second bipolar transistors TV1 and TV2.

The inventive circuitry will be subjected to a quantitative analysis below using a simple analytical model. Here, the difference between the first output current $I_1$ and the second output current $I_2$ is defined as the differential-amplifier output current $I_a$. In addition, the differential-amplifier input voltage $U_e$ is defined, in accordance with $I_a = I_1 - I_2$ and $U_e = UV1 - UV2$, as a difference between the first input voltage UV1 and the second input voltage UV2. Moreover, a simple exponential connection is assumed between the base-emitter voltage and the collector current, which connection neglects the influence of the collector-emitter voltage.

Besides, it is assumed that the voltage-divider network, which consists of first and second resistors 344 and 346, is loaded slightly only, so that at the central node 354 the average of the first input voltage UV1 and the second input voltage UV2 is applied. A change in the voltage at the central node 354 due to the base currents of third bipolar transistor TV3 and fourth bipolar transistor TV4 is neglected. What is taken into account, on the other hand, is an enlarged emitter area of the third and fourth bipolar transistors TV3, TV4, it being assumed that the current is proportional to the emitter area.

An analytical circuit analysis performed with the simplifying assumptions described above leads to the result that the differential-amplifier circuit 310 exhibits a large-signal characteristic described by the following connection:

$$I_a = I_k \frac{e^{\frac{U_e}{U_T}} - 1}{e^{\frac{U_e}{U_T}} + 1 + 2ne^{\frac{U_e}{2U_T}}} \tag{5}$$

Here, n is a parameter for the emitter area. In a suitable configuration, the differential-amplifier circuit 310 has a relative error of only 0.035% for a differential-amplifier input voltage $U_e = U_T$. Also, its linearity is considerably better than that of a conventional differential-amplifier stage with a current source and two bipolar transistors. Thus, an inventive differential-amplifier stage is considerably better suited for temperature compensation of a logarithmizer. The transfer characteristic of the inventive differential-amplifier circuit 310 may be developed in the following manner, for n=2, into a Taylor series around the zero point (the emitter areas of the third and fourth bipolar transistors being double the size, respectively, of that of the emitter areas of the first and second bipolar transistors):

$$I_a \approx I_k \left( \frac{1}{6} \frac{U_e}{U_T} - \frac{1}{17280} \frac{U_e^5}{U_T^5} + \frac{1}{580608} \frac{U_e^7}{U_T^7} - \cdots \right). \tag{6}$$

Since the element of the third order is missing, the relative error equals $$\varepsilon_{rel} \leq -\frac{1}{17280} \left( \frac{U_e}{U_T} \right)^4 = -\frac{1}{2880} \left( \frac{U_e}{U_T} \right)^4. \tag{7}$$

This results in a relative error of $\varepsilon_{rel} \leq 0.035\%$ for $U_e = U_T$.

FIG. 4 shows a transfer characteristic curve of an inventive differential amplifier in accordance with a fourth embodiment of the present invention. FIG. 4 thus describes the transfer characteristic curve of the differential amplifier 310 analyzed above. The differential-amplifier input voltage $U_e$ is plotted, in a normalized manner, versus the thermal voltage $U_T$ on the abscissa. The ordinate depicts the output current $I_a$, which is defined as the difference between first output current $I_1$ and the second output current $I_2$, in relation to the base current $I_k$ of current source 326. What is shown is a number of characteristic curves for different ratios n of the areas of third and fourth bipolar transistors TV3, TV4, and of first and second bipolar transistors TV1, TV2, respectively.

Figure 6:
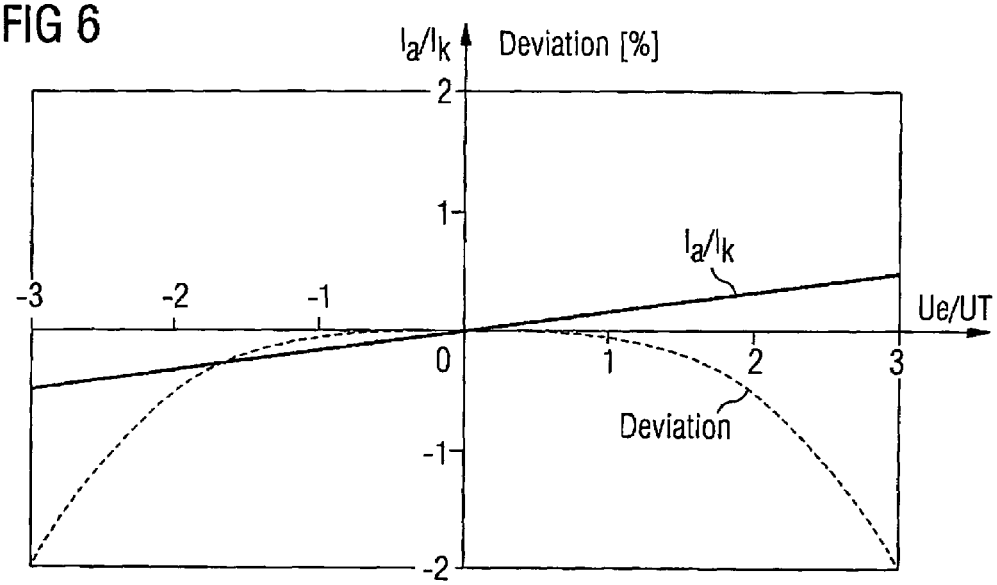
FIG. 6 shows an error characteristic curve of an inventive differential amplifier in accordance with a fourth embodiment of the present invention.

FIG. 6 shows an error characteristic of an inventive differential-amplifier circuit 310 in accordance with a fourth embodiment of the present invention. The parameter n for the emitter area here equals 2 (n=2). The differential-amplifier input voltage $U_e$ in relation to the thermal voltage $U_T$ is plotted on the abscissa. The ordinate shows the difference output current $I_a$, defined as described above, in relation to the base current $I_k$ of current source 326. Also shown is a relative deviation of the differential output current $I_a$ from a target differential output current which results from a linearization of the actual differential output current $I_a$ around point $U_e=0$. It can be seen that the following is applies to $U_e=U_T$: $\epsilon_{rel} \leq 0.035\%$.

Figure 7:
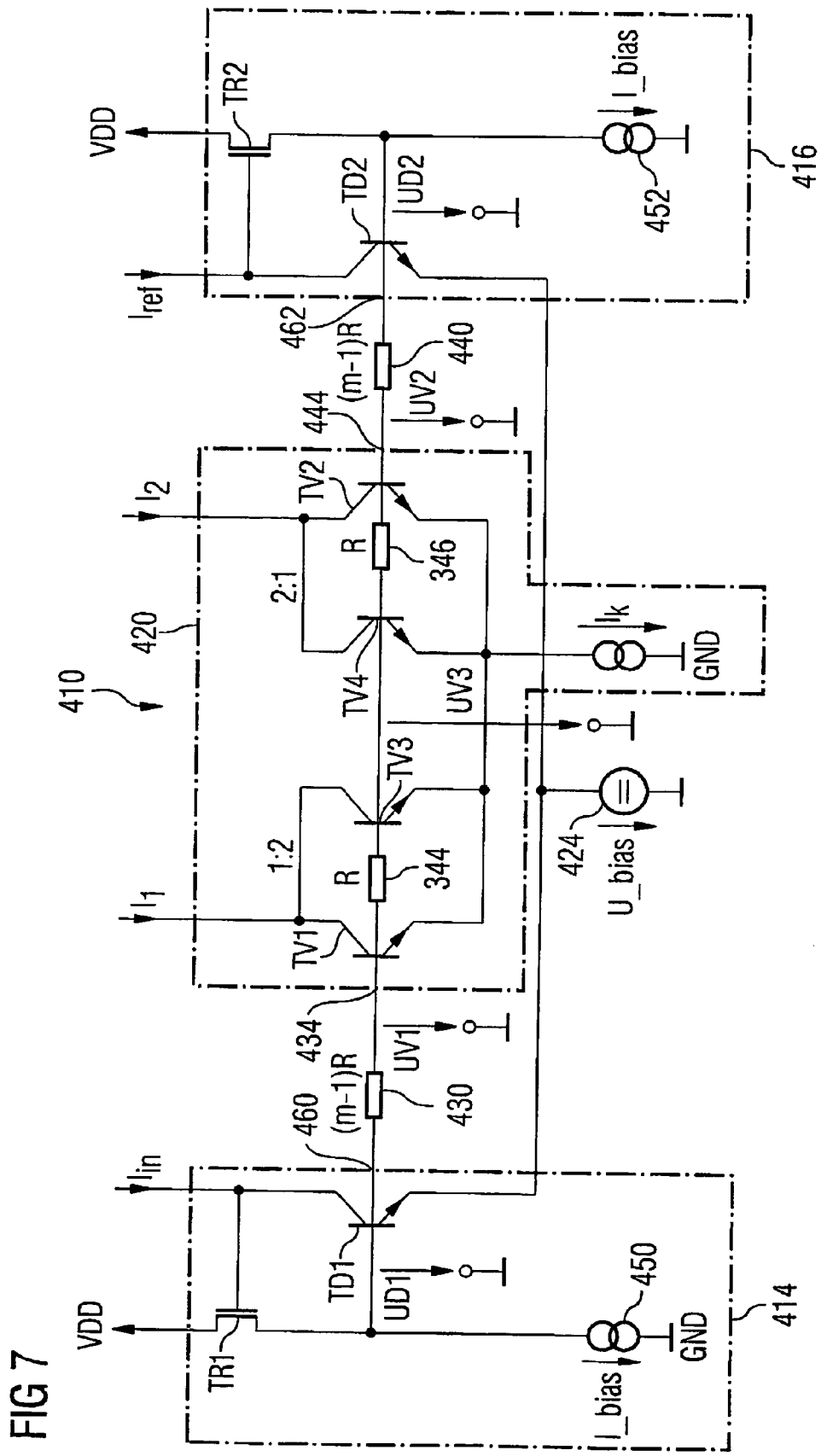
FIG. 7 shows a circuit diagram of an inventive logarithmizer in accordance with a fifth embodiment of the present invention.

FIG. 7 depicts a circuit diagram of an inventive log circuit in accordance with a fifth embodiment of the present invention. The log circuit is designated by 410 in its entirety. It includes a first individual logarithmizer 414 as well as a second individual logarithmizer 416 as well as a differential-amplifier circuit 420. A common operating-point voltage source 424 exists for the two individual logarithmizers 414, 416. The first individual logarithmizer receives an input current signal $I_{in}$ and is connected to a first differential-amplifier input 434 of the differential-amplifier circuit 420 via a first coupling resistor 430. The second individual logarithmizer 416 receives a reference current signal $I_{ref}$ and provides its output signal via a second coupling resistor 440 to a second differential-amplifier input 444 of the differential-amplifier circuit 420.

The first individual logarithmizer 414 and the second individual logarithmizer 416 are identical in architecture, so that only one of the individual logarithmizers will be described here. The input current signal and/or reference current signal is fed to the collector terminal of a bipolar transistor TD1, TD2. The collector terminal is also connected to the gate terminal of an nMOS field-effect transistor TR1, TR2. The emitter terminal of bipolar transistor TD1, TD2 is set to a fixed potential by an operating-point voltage source 424. The drain terminal of nMOS field-effect transistor TR1, TR2 is connected to a positive supply voltage VDD. The source terminal of nMOS field-effect transistor TR1, TR2 is connected to the base terminal of the bipolar transistor TD1, TD2. In addition, an individual logarithmizer includes an operating-point current source 450, 452 connected to the base terminal of bipolar transistor TD1, TD2. The second terminal of the operating-point current source is connected to reference potential GND. The operating-point current source supplies a current of a magnitude of I_bias. The logarithmized signal 460, 462 is tapped off at the base terminal of bipolar transistor TD1, TD2 (first individual-logarithmizer voltage UD1, second individual-logarithmizer voltage UD2).

With their base-emitter paths, bipolar transistors TD1, TD2 constitute the bipolar diodes for logarithmization. With the two operating-point current sources 450, 452, which each provide operating-point current I_bias, nMOS field-effect transistors TR1 and TR2 regulate the base-emitter voltages of bipolar transistors TD1, TD2 in accordance with the input current signal $I_{in}$ and the reference current signal $I_{ref}$, respectively. The operating-point voltage source 424, which provides an operating-point voltage of the magnitude of U_bias, ensures that the voltage drop across the two operating-point current sources (I_bias) is sufficiently high. An advantage of the individual logarithmizers 414, 416 represented is the fact that due to the nMOS field-effect transistors TR1 and TR2, the collector potentials of bipolar transistors TD1, TD2 are kept at nearly equal values. This eliminates the Early effect with the bipolar transistors to a very high extent. The overall circuit further includes a differential-amplifier circuit 420. Said differential-amplifier circuit is identical with differential-amplifier circuit 310 described with reference to FIG. 4 and will therefore not be further explained herein. However, it is to be stated that in the log circuit 410, the voltage of the central node 354, in relation to the reference potential GND, is designated by UV3 In addition, it is to be stated that the output signal of log circuit 410 is defined as the difference between the first output current $I_1$ and the second output current $I_2$: $I_a=I_1-I_2$. The input signal of the log circuit is the input current signal $I_{in}$. The actual input voltage for the temperature-compensation circuit (differential-amplifier circuit 420) is defined as $U_e=UV1-UV2$.

In addition, with log circuit 410, individual logarithmizers 414, 416 are coupled to the inputs 434, 444 of the differential-amplifier circuit 420 via coupling resistors 430, 440. The coupling resistors 430, 440 cooperate with first resistor 340 and second resistor 346 of the differential-amplifier circuit 420 as a voltage-divider network. The voltage between the first differential-amplifier input 434 and the second differential-amplifier input 444 decreases due to the voltage divider. Since, depending on the dynamic range for the input current signal $I_{in}$, a certain level of linearity is required of the logarithmized input signal, the dynamic range of log circuit 410 may be extended, with an identical relative error, by parameter m of coupling resistors 430, 440. Then, the relative error becomes $$\varepsilon_{rel} \leq -\frac{1}{2880}\left(\frac{U_L}{mU_T}\right)^4 \quad (8)$$

with $U_L=UD1-UD2$ and $U_e=U_L/M$, whereby a larger voltage difference $U_L$ between the first logarithmized signal 460 and the second logarithmized signal 462 becomes admissible with an identical relative error. As a consequence, this allows a wider input signal range.

Figure 8:
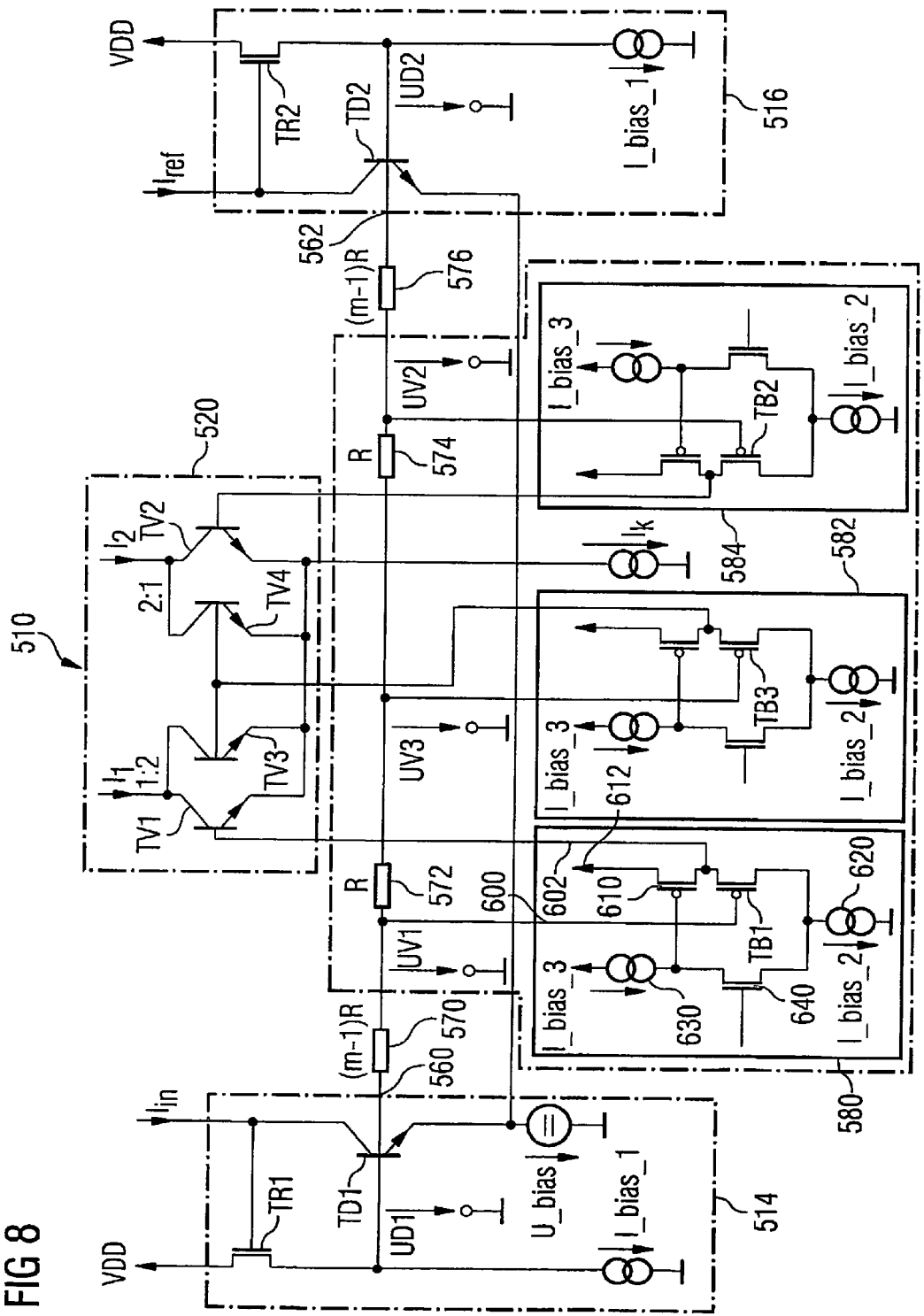
FIG. 8 shows a circuit diagram of an inventive logarithmizer in accordance with a sixth embodiment of the present invention.

FIG. 8 shows a circuit diagram of an inventive log circuit in accordance with a sixth embodiment of the present invention. The log circuit is designated by 510 in its entirety and is based, for the most part, on log circuit 410 described with reference to FIG. 7. As far as components, or the functionality, of log circuit 510 and log circuit 410 match, this will no longer be described separately here. Rather, reference shall be made to the description of log circuit 410. Log circuit 510 includes two individual logarithmizers 514, 516, and a differential-amplifier circuit 520. The individual logarithmizers here provide a first logarithmized signal 560 and a second logarithmized signal 562. Said signals are fed to a voltage-divider network consisting of four resistors 570, 572, 574, 576. While with log circuit 410, the base terminals of the resistors are directly connected to the inner nodes of the resistive voltage-divider network consisting of four resistors, with log circuit 510, three buffer circuits 580, 582, 584 are connected between the inner nodes of the resistive voltage-divider network and the base terminals of the bipolar transistors of the differential-amplifier circuit 520.

The buffer circuits are structured in a similar manner. In the present embodiment, a buffer circuit includes three transistors and two constant-current sources. The gate terminal of a first pMOS field-effect transistor TB1 is connected to a buffer input signal 600. The buffer output signal 602 is tapped off at the source terminal of pMOS field-effect transistor TB1. The respective node is connected, in addition, to a positive supply voltage 612 via the drain-source path of a second pMOS field-effect transistor 610. The drain node of first pMOS field-effect transistor TB1 is coupled to a current source 620 providing a current of a magnitude I_bias_2. The gate terminal of second pMOS field-effect transistor 610 is coupled to a current source 630 and is additionally connected to a current source 620 and to the drain terminal of first pMOS field-effect transistor TB1 via the drain-source path of an nMOS field-effect transistor 640.

Transistors TB1, TB2 and TB3 of the three buffer circuits 580, 582, 584 work as buffers transistors in current feedback loops. Constant currents of magnitudes I_bias_2–I_bias_3 flow through all three of them, so that they have constant gate-source voltages. Thereby, voltages UV1, UV2 and UV3 are mapped, in a buffered manner, to the bases of transistors TV1, TV2, TV3, and TV4. If the current amplifications of the bipolar transistors change due to the influence of temperature or due to process variations, the altered base currents are readjusted by the current feedback loop without any change occurring in the voltages at the bases of TV1, TV2, TV3, and TV4. If, specifically, the base current consumption of transistors TV1, TV2, TV3 or TV4, respectively, changes, the gate potential of the second pMOS field-effect transistor 610 changes in such manner that the voltage applied to the source terminal of first pMOS field-effect transistor TB1 remains constant. In other words, by means of a change in the current flowing through its drain-source path, second pMOS field-effect transistor 610 balances out variations in the current consumption of differential amplifier transistors TV1, TV2, TV3, and TV4, respectively.

This leads to a reduction in the relative errors of log circuit 510. Specifically, since the current amplifications of the individual bipolar transistors are also accounted for in the absolute errors of the circuit depicted, it may happen that the base currents applied to resistors 344, 346, 430, 440 of the resistor network of a log circuit 410 cause error voltages which are so large as to exceed the admissible relative error. In addition, due to the fact that the current amplifications of the bipolar transistors are also dependent on the temperature, the result is a temperature dependency of log circuit 410 which is difficult to compensate for. Log circuit 510 is thus a circuit which is supplemented in comparison with log circuit 410 and which operates independently of the current amplifications of the bipolar transistors.

In addition, it is to be mentioned that for forming the output signal of the log circuit, the difference between a first output current $I_1$ and a second output current $I_2$ needs to be formed. ($I_a = I_1 - I_2$). This may be accomplished with conventional current mirror circuits.

The total transfer characteristic for the log circuit is as follows:

$$I_a = I_k \frac{\sqrt[m]{\frac{I_{in}}{I_{ref}}} - 1}{\sqrt[m]{\frac{I_{in}}{I_{ref}}} + 1 + 42m\sqrt[m]{\frac{I_{in}}{I_{ref}}}} = \qquad (9)$$

$$I_k \left( \frac{1}{6m} \ln \frac{I_{in}}{I_{ref}} - \frac{1}{17280} \left( \frac{1}{m} \ln \frac{I_{in}}{I_{ref}} \right)^5 + \frac{1}{580608} \left( \frac{1}{m} \ln \frac{I_{in}}{I_{ref}} \right)^7 - \dots \right) \approx$$

$$\frac{I_k}{6m} \ln \frac{I_{in}}{I_{ref}}$$

Here, the total relative error is $$\varepsilon_{rel} \leq -\frac{1}{2880} \left( \frac{1}{m} \ln \frac{I_{in}}{I_{ref}} \right)^4 \qquad (10)$$

Figure 9:
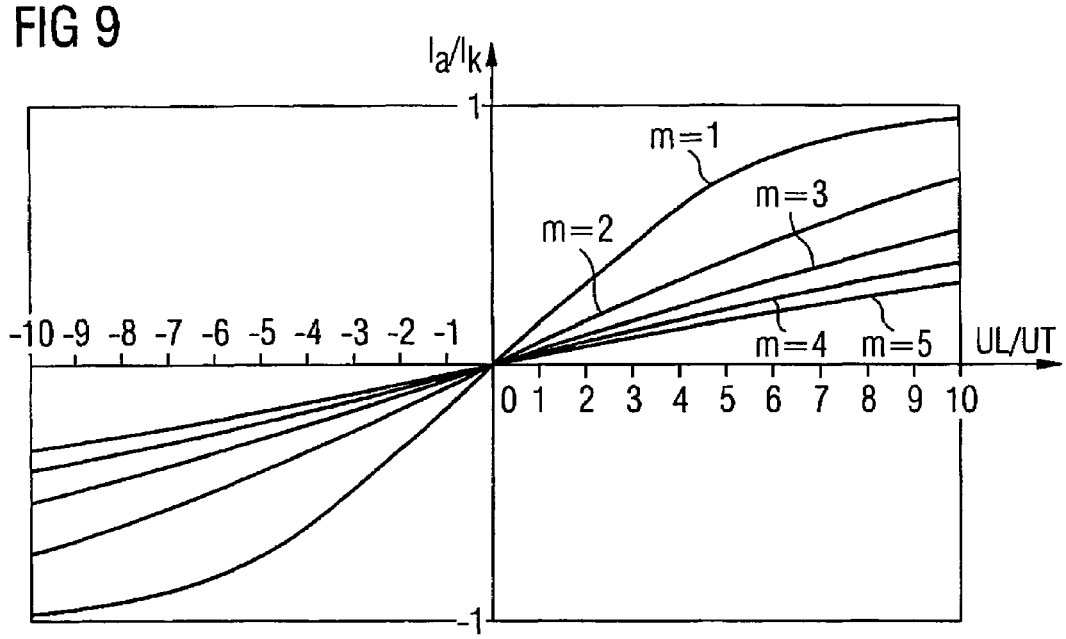
FIG. 9 shows a transfer characteristic curve of an inventive logarithmizer in accordance with a sixth embodiment of the present invention.

FIG. 9 shows the transfer characteristic of a log circuit 410 as is described by means of FIG. 7. The voltage difference $U_L$ between the two individual logarithmizers (with $U_L$=UD1–UD2) is plotted, in a normalized manner, against thermal voltage $U_T$ on the abscissa. The ordinate shows the output current $I_a$ (with $I_a = I_1 - I_2$), normalized in relation to the base current $I_k$. Parameter m, which describes the magnitude of coupling resistors 430, 440, here varies between m=1 and m=5. It is obvious that, as parameter m increases, the linear range of the circuit increases.

The circuitry described may be varied within a wide range without departing from the core concept of the invention. For example, it is possible, with an inventive differential-amplifier circuit, to exchange bipolar transistors for field-effect transistors, as long as it is ensured that the temperature dependency of the amplification of the differential-amplifier circuit is still specified by a thermal voltage. This may be achieved, for example, by using bipolar transistors in the current source circuits, which perform the setting of the operating point of the actual differential amplifier core. In this context, it shall be pointed out that here, use may be made of a consistent designation of the transistor terminals both for bipolar transistors and for field-effect transistors. The gate terminal and/or the base terminal of a transistor is called the control terminal of a transistor. The designation "source terminal" also characterizes an emitter terminal, since in this region, charge carriers are made available. Finally, the term "collective terminal" describes a drain terminal of a field-effect transistor, and/or a collector terminal of a bipolar transistor. This functional labeling of the transistor terminals enables bipolar transistors and field-effect transistors to be described in a consistent manner.

In addition, it is possible to replace the above-described circuits by circuits which are complementary thereto. npn bipolar transistors here are replaced by pnp bipolar transistors, and vice versa, nMOS field-effect transistors are replaced by pMOS field-effect transistors, and vice versa. The polarity of the supply voltage also changes accordingly.

In addition, the present description occasionally differentiates between current signal and voltage signal. However, the type of signal characterizes only an expedient signal type. The use of a current-voltage converter and/or a voltage-current converter is, of course, possible in the circuit, so that both signal types may be interconverted. In particular, voltage signals may be used as the input signal of the log circuit if said voltage signals are converted into current signals, e.g. using a suitable operational-amplifier circuit.

The output signal of the inventive log circuit may also be formed in one of a variety of ways. The present description refers to the actual output signal as the difference between a first output current $I_1$ and a second output current $I_2$. However, it is just as well possible to consider the two output currents $I_1$ and $I_2$ as output signals. This particularly makes sense if a circuit connected downstream from the log circuit can process the difference between two currents. Likewise, it is possible to convert the two output currents $I_1$ and $I_2$ into a voltage signal. The simplest way to do this is to use load resistors. This gives rise to two voltages which are dependent on $I_1$ and $I_2$, respectively, and the difference between which is a measure of the difference between $I_1$ and $I_2$. The two voltages may then either both be fed, as a differential input signal, to a stage connected downstream from the log circuit, or be converted into a single voltage output signal by means of forming a direct difference. It thus may be stated that the present invention is not limited by the type of output signal.

In addition, there is a high level of flexibility with regard to the selection of the emitter area of bipolar transistors used in an inventive differential-amplifier circuit. Moreover, the emitter area is analogous to the channel width of field-effect transistors, which may also be used. The emitter area and/or the channel width may be the same for all transistors, but may also be selected to be different. An emitter area of the third and fourth bipolar transistors which is about twice the size of the emitter area of the first and second bipolar transistors has proved to be particularly advantageous, but changes to the emitter area are quite possible.

With a differential-amplifier circuit 410 it is possible to dispense with the coupling resistors 430, 440. This corresponds to selecting parameter m to be 1. In this case, the differential amplifier has a maximum sensitivity, the linearity range, however, is limited. As a result, it may be quite useful, with a highly linear layout of differential amplifier 420, to completely dispense with coupling resistors 430, 440. The same applies to coupling resistors 570, 576 of log circuit 510.

In addition, it is possible to largely change the buffer circuits 580, 582, 584 depicted by means of FIG. 8, as long as it is ensured that the buffer output voltage follows the buffer input voltage and is largely independent of the load of the buffer output constituted by the bipolar transistor. In particular, it is also feasible to employ an operational-amplifier circuit as a buffer circuit, provided that the increased expenditure in components resulting therefrom is admissible. However, other buffer realizations, which include only a small number of transistors, are also feasible. What is decisive is that the voltage-divider network comprises only a minor load.

Finally, it should be pointed out that an inventive circuitry may be configured both as a discrete circuit and in a monolithically integrated manner. With discrete realizations, care is to be taken to ensure good thermal coupling is ensured between the different circuit parts, in particular between the individual logarithmizers and the differential-amplifier circuit, and that the relevant circuit parts all have the same absolute temperature.

In addition, it is to be stated that an inventive highly linear differential-amplifier circuit may also be used independently of a log circuit. The differential-amplifier circuit provides the essential benefit of having a high level of linearity and thus a large useful input difference voltage range. If necessary, a stabilization of the amplification may be desirable when using the differential-amplifier circuit in a different field of application, i.e. not in connection with a log circuit. Various circuit topologies may be used for this purpose, for example current feedback in the emitter and/or source paths. A variation of the collector current by means of a suitable network is also feasible. Likewise, an offset voltage may be applied to one of the differential-amplifier inputs if only one input of the differential amplifier is required as a signal input.

Thus, the present invention in its entirety solves the problem of mapping an input signal with a small error in a logarithmic manner to an output signal while compensating for temperature effects. Here, an input signal range of several decades having a very small relative error (<0.001 or even smaller) may be mapped to the output by means of the principle presented. The present invention solves the problem of temperature compensation of the logarithmizing diodes in that a circuit is connected downstream from the diodes which has a highly linear transfer characteristic and simultaneously compensates for the temperature effect of the diode thermal voltage by physically the same thermal voltage. This results in the advantages of a log circuit which is temperature-compensated in an optimum manner and which at the same time performs a logarithmizing function with a very small error over several decades of the input signal. In addition, the circuit concept is implemented such that the circuit expenditure is very limited, as a result of which the current consumption is low. The core of the invention is the optimum temperature compensation of a diode logarithmizer by means of a highly linear circuit, which, in combination with two logarithmizing diodes, results in a logarithmizing circuit having a very high level of accuracy (<0.001 and even smaller).

Thus, the circuit principle presented is very well suited for highly accurate logarithmic mapping of an input signal (input current) to an output signal (output current). Here, the logarithmic ratio is set via bipolar diodes, the occurring temperature coefficient, however, being corrected by a subsequent circuit having exactly the same temperature dependency. This leads to several advantages over conventional circuit principles, such as exact compensation of the diode temperature coefficient, which has been possible only to a limited extent with conventional circuits, for example by resistive dividers and/or temperature-dependent resistors, and the achievable high level of linearity of the logarithmic ratio. Finally, a potential circuit realization is possible at a relatively low expense.

In addition, an inventive circuitry is not tied to the use of bipolar log elements. Rather, it is also possible to use, as log elements, MOSFET diodes operated with a weak inversion, and/or other components based on the field effect and having a diode-type characteristic curve. What is decisive here is only the fact that the log elements are operated in an operating range wherein they exhibit an exponential characteristic curve. Due to the energy distribution of the moveable carriers, the result is a temperature dependency which may be compensated for by a subsequent differential amplifier. The elements in the differential amplifier which determine the amplification must comprise, for this purpose, a characteristic running counter to the log elements' temperature dependency. In addition to bipolar transistors, field-effect transistors are also suitable for this purpose, if their operating points are suitably selected. An appropriate circuitry is formed in that in one of the above-described circuitries, bipolar elements are replaced by field-effect elements. With transistors, the base terminal of a bipolar transistor corresponds to the gate terminal of the respective field-effect transistor, the emitter terminal corresponds to the source terminal, and the collector terminal corresponds to the drain terminal. pnp bipolar transistors correspond to p-channel field-effect transistors, pnp bipolar transistors correspond to n-channel field-effect transistors. Similarly, the bipolar log elements shown may be replaced by such log elements which exploit the field effect.

In addition, it is possible to configure log elements and circuit elements of the differential amplifier in different technologies as long as it is ensured that the temperature dependencies are based on the same physical effect and are run counter to one another. For example, one may use log elements which exploit the field effect, such as MOSFET diodes in a weak inversion, whereas the differential amplifier is constructed with bipolar transistors. A reverse solution is also possible.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A log circuit comprising:
    an operand signal input for receiving an operand current signal;
    a reference signal input for receiving a reference current signal;
    an operand log circuit including a first semiconductor device having a first control terminal and configured to receive the operand current signal at a first collective terminal and a second semiconductor device configured to receive the operand current signal at a second control terminal and regulate a first logarithmized signal on the first control terminal;
    a reference log circuit configured to provide a second logarithmized signal based on the reference current signal; and
    a differential-amplifier circuit including a first differential-amplifier input for receiving the first logarithmized signal, a second differential-amplifier input for receiving the second logarithmized signal, and a differential-amplifier output for outputting a differential-amplifier output signal as a function of the first logarithmized signal and the second logarithmized signal.

2. A log circuit according to claim 1, wherein the first logarithmized signal is based on a load-carrier distribution that describes an energy distribution of moveable charge carriers in a semiconductor material and is based on a temperature of the semiconductor material.

3. A log circuit according to claim 2, wherein the load-carrier distribution is one of a Boltzmann distribution and a Fermi-Dirac distribution.

4. A log circuit according to claim 1, wherein the first logarithmized signal is proportional to an absolute temperature exhibited by the log circuit, the second logarithmized signal is proportional to the absolute temperature exhibited by the log circuit, and amplification of the differential-amplifier circuit is inversely proportional to the absolute temperature.

5. A log circuit according to claim 1, wherein the differential-amplifier circuit has a highly linear transfer characteristic characterized in that a relative error of the differential-amplifier output signal is smaller than 1% if the amount of a voltage difference between the first logarithmized signal and the second logarithmized signal equals a thermal voltage of $(k*T)/q$.

6. A log circuit according to claim 1, wherein the first semiconductor device has a non-linear characteristic that is the transfer characteristic curve of a bipolar transistor.

7. A log circuit according to claim 1, wherein the reference log circuit includes a third semiconductor device having a third control terminal and configured to receive the reference current signal at a second collective terminal and a fourth semiconductor device configured to receive the reference current signal at a fourth control terminal and regulate the second logarithmized signal at the third control terminal.

8. A log circuit according to claim 7, wherein the first semiconductor device has a first exponential characteristic curve and the third semiconductor device has a second exponential characteristic curve, wherein the first exponential characteristic curve and the second exponential characteristic curve are dependent on the temperature exhibited by the log circuit, and wherein amplification for the differential-amplifier circuit is based on a fifth semiconductor device, the transfer characteristic of which is dependent on the temperature exhibited by the log circuit.

9. A log circuit according to claim 7, wherein the first semiconductor device is a bipolar semiconductor device, the third semiconductor device is a bipolar semiconductor device, and amplification of the differential-amplifier circuit depends on a thermal voltage of a fifth semiconductor device that is a bipolar semiconductor device.

10. A log circuit according to claim 7, wherein the first semiconductor device is a field-effect device, the third semiconductor device is a field-effect device, and amplification of the differential-amplifier circuit is based on a fifth semiconductor device that is a field-effect device.

11. A log circuit according to claim 7, wherein the first semiconductor device and the third semiconductor device are bipolar transistors.

12. A log circuit according to claim 7, wherein the first logarithmized signal is specified by a first voltage drop across a first bipolar diode junction that is part of the first semiconductor device, a first current, which is based on the operand current signal, flowing through the first bipolar diode junction,
    and the second logarithmized signal is specified by a second voltage drop across a second bipolar diode junction that is part of the third semiconductor device, a second current, which is based on the reference current signal, flowing through the second bipolar diode junction.

13. A log circuit according to claim 12, wherein source terminals of the first semiconductor device and the third semiconductor device have a same potential.

14. A log circuit comprising:
    an operand signal input configured to receive an operand current signal;
    a reference signal input configured to receive a reference current signal;
    an operand log circuit configured to provide a first logarithmized signal based on the operand current signal;
    a reference log circuit configured to provide a second logarithmized signal based on the reference current signal; and
    a differential-amplifier circuit including:
        a first signal input configured to receive the first logarithmized signal;
        a second signal input configured to receive the second logarithmized signal;
        a differential-amplifier output configured to output a differential-amplifier output signal as a function of the first logarithmized signal and the second logarithmized signal, wherein amplification in the differential-amplifier circuit depends on the temperature exhibited by the log circuit such that in the differential amplifier output signal the temperature dependency of the difference between the first logarithmized signal and the second logarithmized signal is counteracted, wherein the differential-amplifier output includes a first signal output and a second signal output;

first, second, third and fourth transistors comprising respective source terminals, collective terminals and control terminals;

a current source circuit;

the source terminals of the first, second, third and fourth transistors being connected to the current source circuit;

the collective terminals of the first and third transistors being coupled to the first signal output;

the collective terminals of the second and fourth transistors being coupled to the second signal output; and the control terminal of the first transistor being coupled to the first signal input, and the control terminal of the second transistor being coupled to the second signal input; and a control voltage circuit for providing control voltages at the control terminals of the third and fourth transistors on the basis of a combination of input voltages applied to the first signal input and the second signal input.

15. A log circuit comprising:

an operand signal input configured to receive an operand current signal;

a reference signal input configured to receive a reference current signal;

an operand log circuit configured to provide a first logarithmized signal based on the temperature exhibited by the log circuit and the operand current signal;

a reference log circuit configured to provide a second logarithmized signal based on the temperature exhibited by the log circuit and the reference current signal; and a differential-amplifier circuit including first and second transistors and a current source configured to amplify the difference between the first logarithmized signal and the second logarithmized signal based on the temperature exhibited by the log circuit, wherein the temperature dependency of the difference between the first logarithmized signal and the second logarithmized signal is counteracted by the temperature dependency of the amplification by the first and second transistors and the current source.

* * * * *